US007771541B2

(12) United States Patent
Blais et al.

(10) Patent No.: US 7,771,541 B2
(45) Date of Patent: Aug. 10, 2010

(54) METHOD OF REMOVING METALLIC, INORGANIC AND ORGANIC CONTAMINANTS FROM CHIP PASSIVATION LAYER SURFACES

(75) Inventors: Claude Blais, Granby (CA); Eric Duchesne, Granby (CA); Kang-Wook Lee, Yorktown Heights, NY (US); Sylvain Ouimet, Saint-Hubert (CA); Gerald J. Scilla, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 11/689,570

(22) Filed: Mar. 22, 2007

(65) Prior Publication Data
US 2008/0233755 A1 Sep. 25, 2008

(51) Int. Cl.
*B08B 7/00* (2006.01)
*C23F 1/00* (2006.01)
(52) U.S. Cl. .......................... 134/1.2; 134/1.1; 134/1.3; 216/58; 216/64; 216/74
(58) Field of Classification Search .................. 134/1.1, 134/1.2, 1.3; 216/58, 64, 74
See application file for complete search history.

(56) References Cited

U.S. PATENT DOCUMENTS

| 5,578,863 | A | * | 11/1996 | De Poorter | .................. 257/433 |
| 5,882,423 | A | * | 3/1999 | Linn et al. | .................... 134/1.1 |
| 6,805,974 | B2 | * | 10/2004 | Choi et al. | .................. 428/646 |
| 2005/0161834 | A1 | * | 7/2005 | Cowens et al. | .............. 257/778 |

* cited by examiner

*Primary Examiner*—Michael Kornakov
*Assistant Examiner*—Natasha Campbell
(74) *Attorney, Agent, or Firm*—Harrington & Smith

(57) ABSTRACT

A method of removing and/or reducing undesirable contaminants removes residues including graphitic layers, fluorinate layers, calcium sulfate ($CaSO_4$) particles, tin oxides and organotin, from a chip passivation layer surface. The method uses a plasma process with an argon and oxygen mixture with optimized plasma parameters to remove both the graphitic and fluorinated layers and to reduce the level of the inorganic/tin oxides/organotin residue from an integrated circuit wafer while keeping the re-deposition of metallic compounds is negligible. This invention discloses the plasma processes that organics are not re-deposited from polymers to solder ball surfaces and tin oxide thickness does not increase on solder balls. The ratio of argon/oxygen is from about 50% to about 99% Ar and about 1% to about 50% $O_2$ by volume. Incoming wafers, after treatment, are then diced to form individual chips that are employed to produce flip chip plastic ball grid array packages.

19 Claims, 6 Drawing Sheets

PRIOR ART

Figure 4 (a)
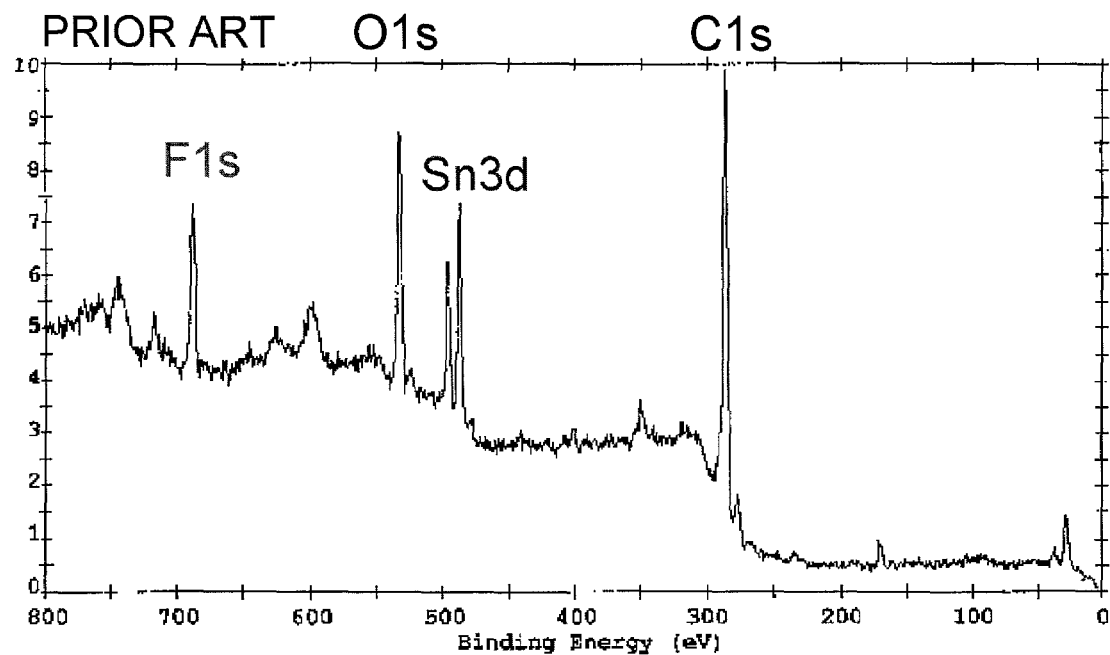
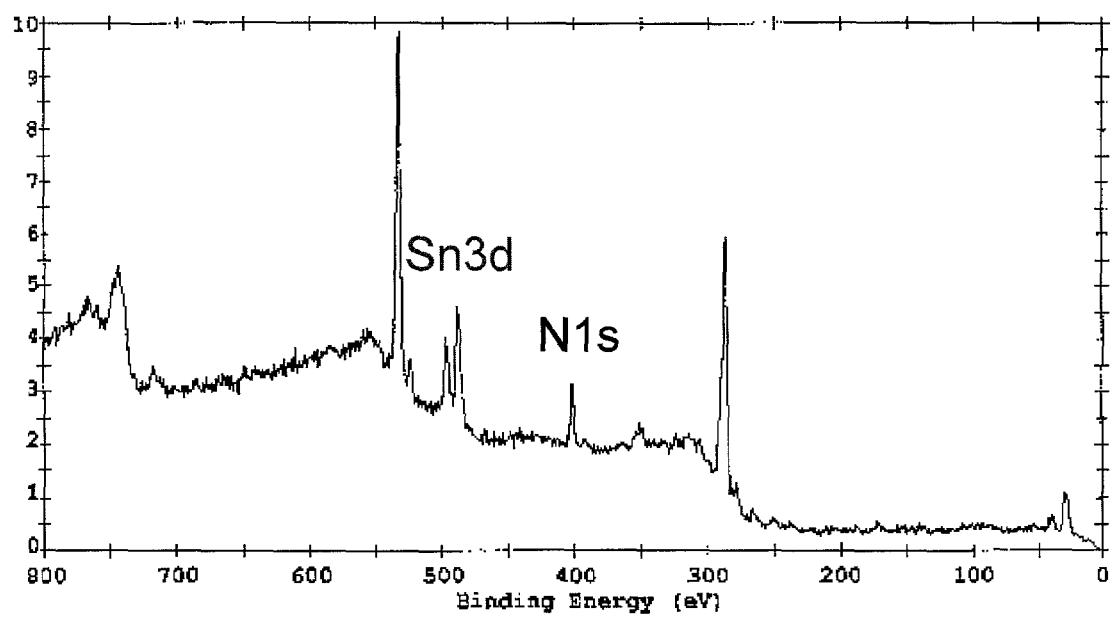
Figure 4 (b)

ated from the manufacturing process of the chip, render the post chip joining cleaning process difficult to implement since a certain level of the residue remains in an uncleaned condition.

METHOD OF REMOVING METALLIC, INORGANIC AND ORGANIC CONTAMINANTS FROM CHIP PASSIVATION LAYER SURFACES

FIELD OF THE INVENTION

The invention relates to the provision of reliable flip chip plastic semiconductor packages, and to a method of removing contaminants from a chip passivation layer with a plasma process using a mixture of argon (Ar) and oxygen ($O_2$) gases.

BACKGROUND OF THE INVENTION

Flip chip packages are becoming more popular as they offer several advantages over traditional wire-bonded packages. These advantages include compactness, ruggedness, and cost. The surface of an advanced flip chip is typically provided with solder balls and a passivation layer. The passivation layer material may be silicon nitride, a polyimide, a photosensitive polyimide or a benzocyclobutane polymer. The solder balls comprise a lead (Pb) and tin (Sn) alloy or a Pb-free alloy, whereby the major metallic component of the latter is Sn. As Pb is an undesirable pollutant, current chips tend to use Pb-free solder balls for bonding to protect the environment. In the process of producing the Pb-free solder balls, the surface of a polymer passivation layer, which is provided, often includes organic, inorganic and/or metallic contaminants.

FIG. 1(a) and FIG. 1(b) show the schematic cross-sections of flip chip plastic ball grid array (FC-PBGA) packages that are built partially and completely, respectively. In a typical manufacturing process of FC-PBGA package 10, as shown in FIG. 1(b), chip 12 with solder balls is placed over and electrically connected to laminate 16 in which electrical contacts of chip 12 on a dielectric surface 15 are electrically connected to circuitry of laminate substrate 16 preferably by a heating cycle to form solder interconnections 14 which may be in the form of solder joints. When the chip 12 is electrically connected to the laminate 16, flux is used to join the flip chip to the laminate through melting of the solder balls. Flux is made of solvents and active ingredients such as organic acids that promote metal to metal bonding. Typical fluxes that are used are classified either as water-soluble or as no-clean fluxes. The subsequently formed flux residue on the surfaces of the chip and the laminate needs to be cleaned since the residue often causes underfill-chip delamination. This cleaning process is called "post chip join cleaning". In the water-soluble fluxes, a post chip join cleaning process comprises applying warm deionized (DI) water into a gap between chip 12 and laminate 16 of a partially manufactured flip chip package 11 in FIG. 1(a). However, contaminants on the chip passivation layer surface, which are introduced in the manufacturing process of the chip, render the post chip joining cleaning process difficult to implement since a certain level of the residue remains in an uncleaned condition.

The dielectric surfaces of the chip and the laminate are treated with oxygen plasma to activate the dielectric surface 15 as well as the laminate surface. As shown in FIG. 1(b), underfill 17 is applied into the gap between the connected contacts of chip 12 and laminate substrate 16. The underfill material is an electrically nonconductive coupling material. The underfill material 17 acts as a buffer for stresses that arise due to the difference between the coefficient of thermal expansion (CTE) of the chip and the laminate substrate as well as due to thermal expansion of solder joints. The underfill material also serves to protect the soldered connections 14 from moisture and may extend past the periphery (or, edge) 20 of chip 12.

However, the underfill-chip interface evidences a tendency to delaminate in the presence of a certain level of residue on the chip passivation layer surface. In that instance, the delamination frequently leads to an extrusion of solder so as to form a tin bridge 27 between adjacent solder joints 14, thereby resulting in electrical shorts. FIGS. 2, 3, and 4(a) illustrate the effects of unremoved residue of a wafer arrangement of a wafer and bonded solder joints. FIGS. 2(a) and 2(b) show the microscope pictures of the chip side of a package that has electrical shorts. FIG. 2(b) shows extruded solder 27 between two solder joints 14 (C4 joints) on the chip surface. FIG. 3(a) shows an example of an X-ray Photoelectron Spectroscopy (XPS) spectrum of an incoming chip that shows a presence of fluorine F1s (1s orbital), oxygen O1s (1s orbital), nitrogen N1s (1s orbital), and carbon C1s (1s orbital). FIG. 3(b) shows a high resolution C1s (carbon) XPS that indicates a typical graphitic layer formation on polyimide. Both the graphitic and the fluorinated layers not only cause underfill-chip delamination but also make the post chip join cleaning difficult so that flux residues are left uncleaned. Upon reflow, tin solder extruded into the small gap between two solder joints to form a bridge of conductive material to produce an electrical short. FIG. 4(a) is an XPS spectrum of the polyimide surface of an electronics chip package cleaned according to prior art methods.

The contaminants on the passivation layer surface of a chip often include organic, inorganic and/or organometallic materials, which are fluorinated and graphitic layers, calcium sulfate ($CaSO_4$) particles, tin oxides, and organotin, respectively. The graphitic and fluorinated layers can be easily removed with a typical $O_2$ gas plasma but the inorganic and organometallic reside cannot be removed with $O_2$ plasma. There is a need to remove or reduce the level of contaminants with a new process to achieve a clean polymer passivation layer surface to provide a reliable FC-PBGA package.

SUMMARY OF THE INVENTION

The exemplary embodiments of the invention provide a technique for removing undesirable contaminants from a chip passivation layer surface using a plasma process with a mixture of Argon and Oxygen gases.

In accordance with a first aspect of the invention, a method to process a circuit assembly comprises placing the circuit assembly in a process chamber; and exposing the circuit assembly to a plasma state that is generated with a mixture of Argon (Ar) and Oxygen ($O_2$) in a range of about 50% Ar and about 50% $O_2$ to about 99% Ar and about 1% $O_2$ by volume, for a period of time sufficient to remove substantially all of a graphitic/fluorinated polymer layer and at least some of an inorganic and organotin residue.

In accordance with a second aspect of the invention, an apparatus for removing contaminants from a wafer arrangement comprises a chamber for containing the wafer arrangement within; a dispenser configured to introduce into the chamber Ar and $O_2$ in a ratio of about 50% Ar and about 50% $O_2$ to about 99% Ar and about 1% $O_2$ by volume; and a plasma generator configured to ionize the gas mixture to form a plasma to clean residue from the wafer arrangement.

In accordance with a third aspect of the invention, a method for removing contaminants from a passivation layer comprises forming a gas mixture comprised of about 50% to about 99% Ar and about 1% to about 50% $O_2$; and exposing a wafer arrangement to the gas mixture in a plasma chamber where a plasma state is created, the wafer arrangement including a passivation layer and solder balls, where the exposing occurs at a gas pressure in a range of about 10 mTorr to about 500 mTorr, at a plasma power in a range of about 100 W to about 1000 W, for a duration in a range of about 1 minute to about 30 minutes.

BRIEF DESCRIPTION OF THE DRAWINGS

The foregoing and other aspects of these teachings are made more evident in the following Detailed Description, when read in conjunction with the attached drawings, wherein:

FIG. 4(a) is an XPS spectrum of the polyimide passivation layer surface from a conventional Pb-free chip that is contaminated a lot with CaSO4, tin oxides and organotin;

FIG. 4(b) is an XPS spectrum of the polyimide surface after the contaminated chip in FIG. 4(a) was treated with an $Ar/O_2$ mixture gas plasma in an embodiment of the invention;

DETAILED DESCRIPTION OF THE INVENTION

A method is provided to remove passivation layer contaminants by treating a surface of a chip or wafer with an $Ar/O_2$ gas mixture plasma. The use of an appropriate mixture of Ar and $O_2$ along with optimized plasma parameters such as pressure and power can remove both the graphitic and fluorinated layers as well as reduce both the inorganic and organotin residue, including calcium sulfate ($CaSO_4$) particles, while the re-deposition of metallic compounds onto the passivation layer is negligible.

The method entails exposing a passivation layer, such as found in a circuit assembly, to a plasma state that is generated with a mixture of Argon (Ar) and Oxygen ($O_2$) in a range of about 50% Ar and about 50% $O_2$ to about 99% Ar and about 1% $O_2$ by volume, where exposing occurs at a pressure in a range of about 10 mTorr to about 500 mTorr, at a plasma power in a range of about 100 W to about 1000 W, for a period of time sufficient to remove substantially all of a graphitic/fluorinated polymer layer and at least some of an inorganic and organotin residue. The period of time of exposure is in a range of about 1 minute to about 30 minutes.

Figure 1A:
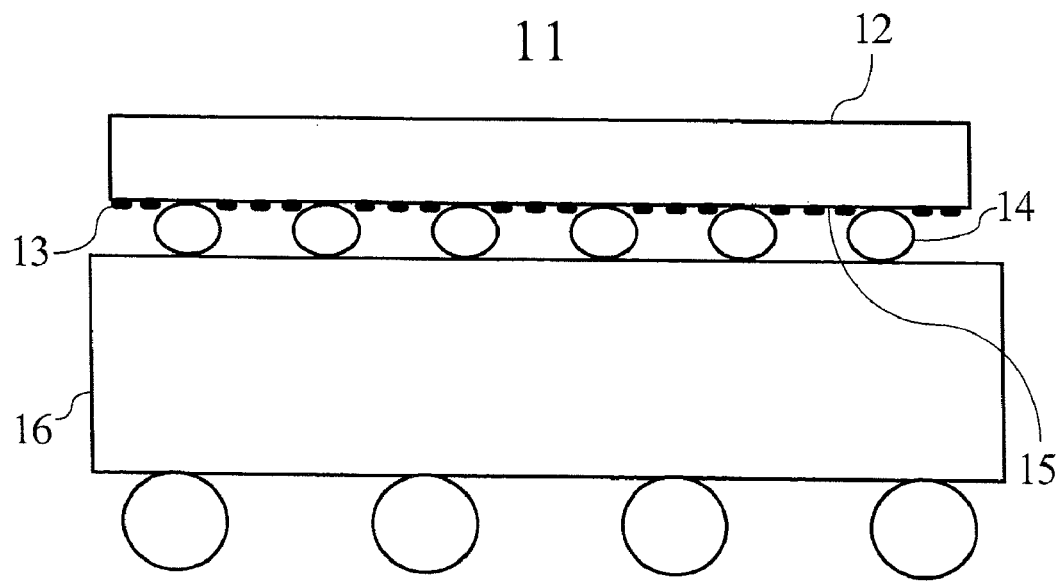
FIG. 1(a) is a schematic cross-section of a FC-PBGA package that is partially built up to flip chip joining.
Figure 1B:
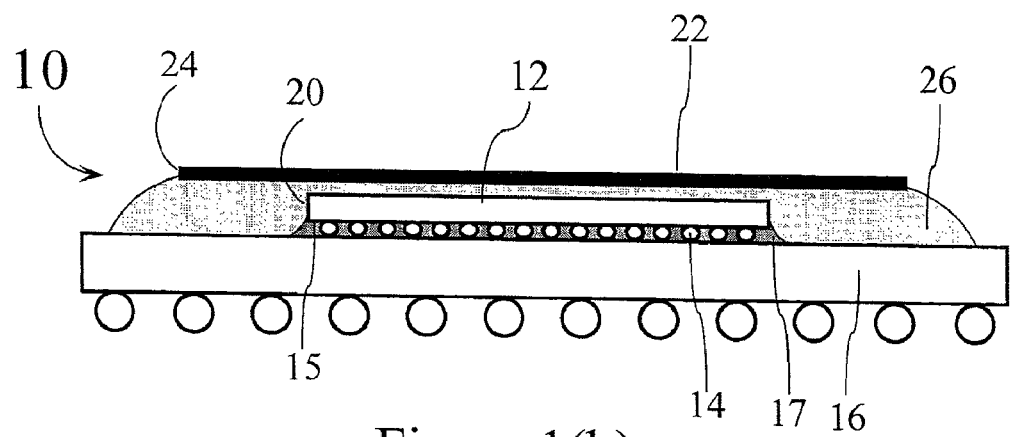
FIG. 1(b) is a schematic cross-section of a FC-PBGA package.
Figure 2A:
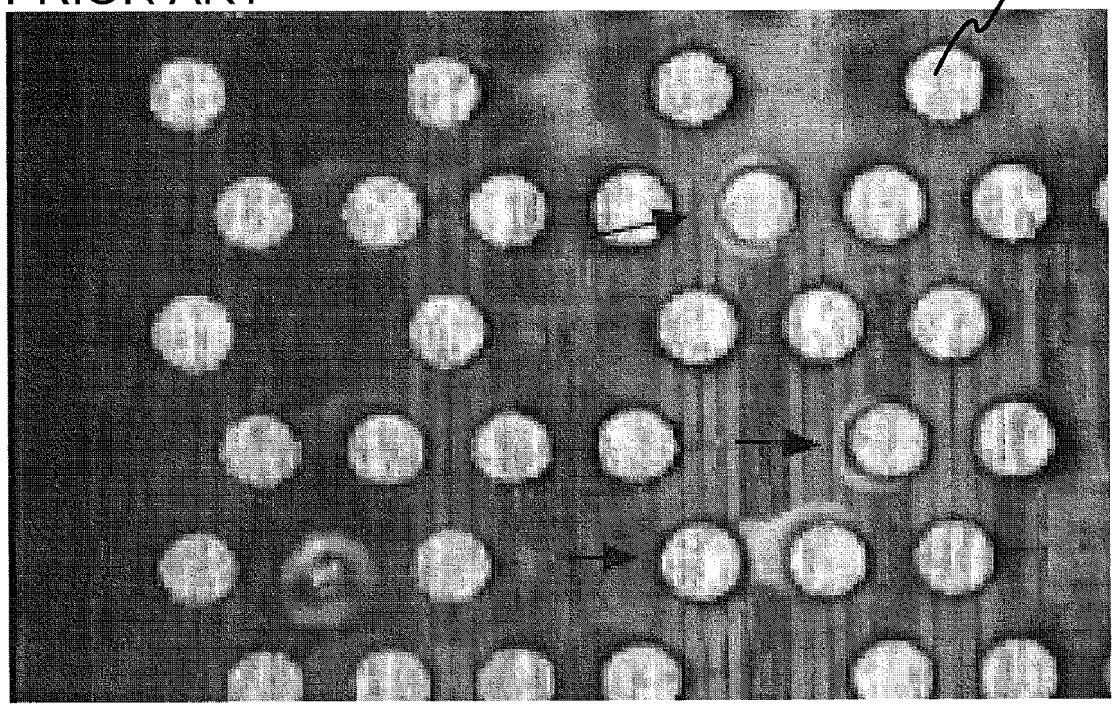
FIG. 2(a) shows a chip surface of a conventional FC-PBGA package in which the underfill and C4 joints structure was ground until the chip surface could be seen.
Figure 2B:
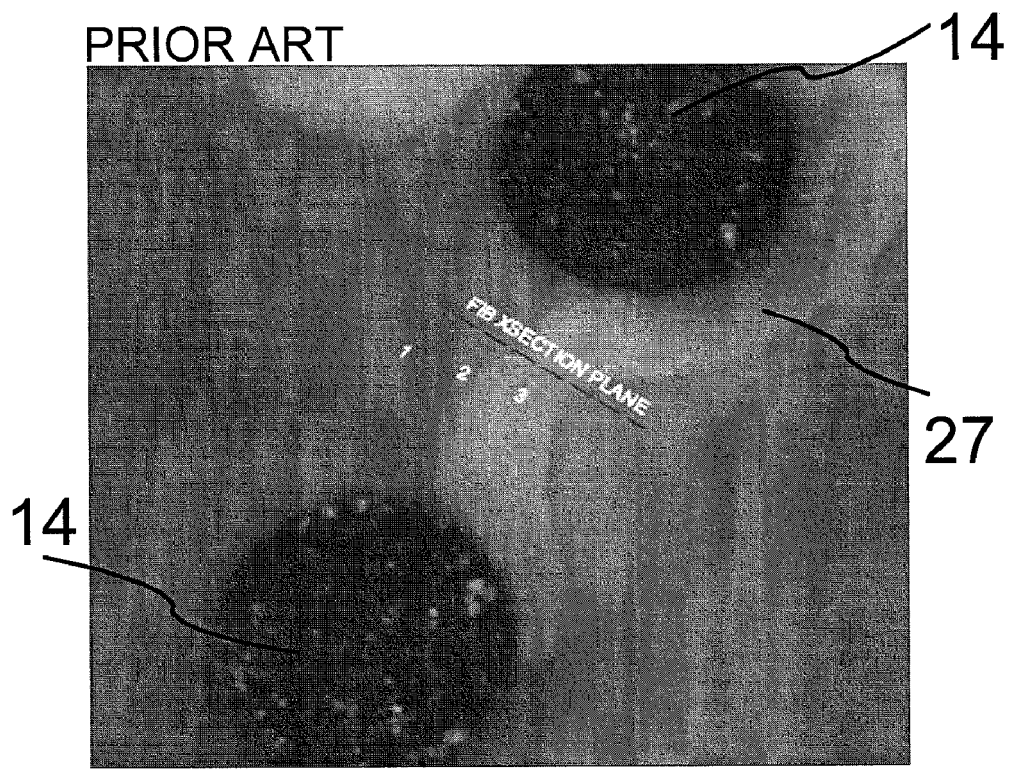
FIG. 2(b) shows extruded Sn solder between two C4 joints on a chip surface, resulting in electrical shorts, as found in the conventional FC-PBGA package of FIG. 2(a)
Figure 3A:
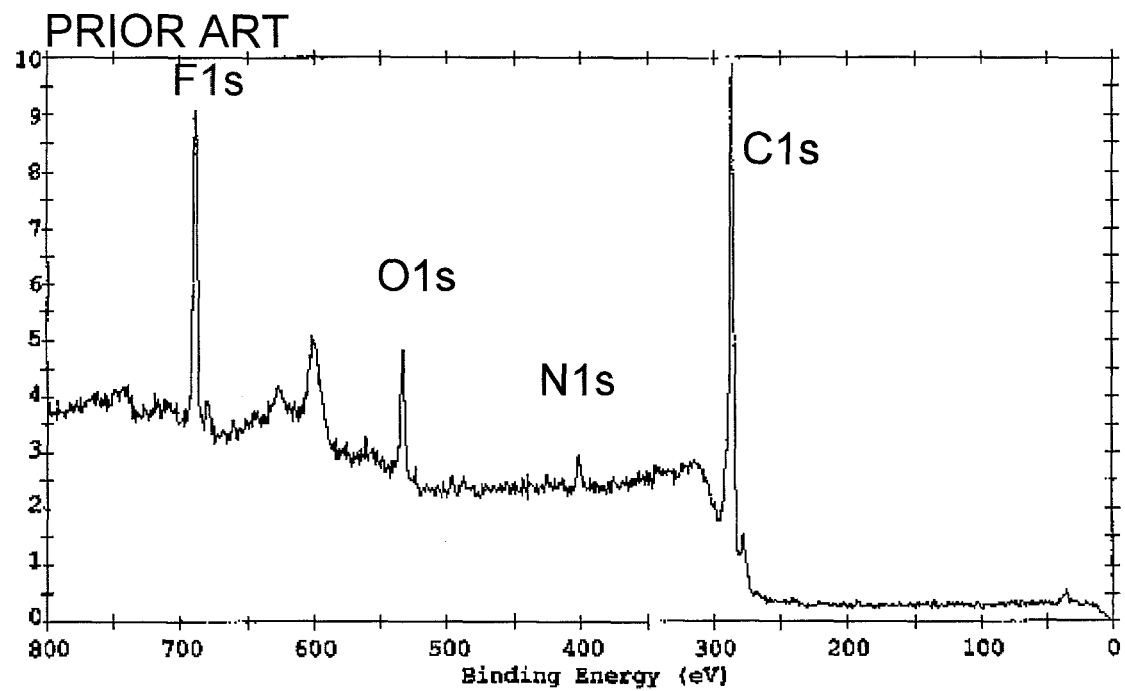
FIG. 3(a) is an XPS spectrum of the polyimide passivation layer surface of a conventional Pb-free chip.
Figure 3B:
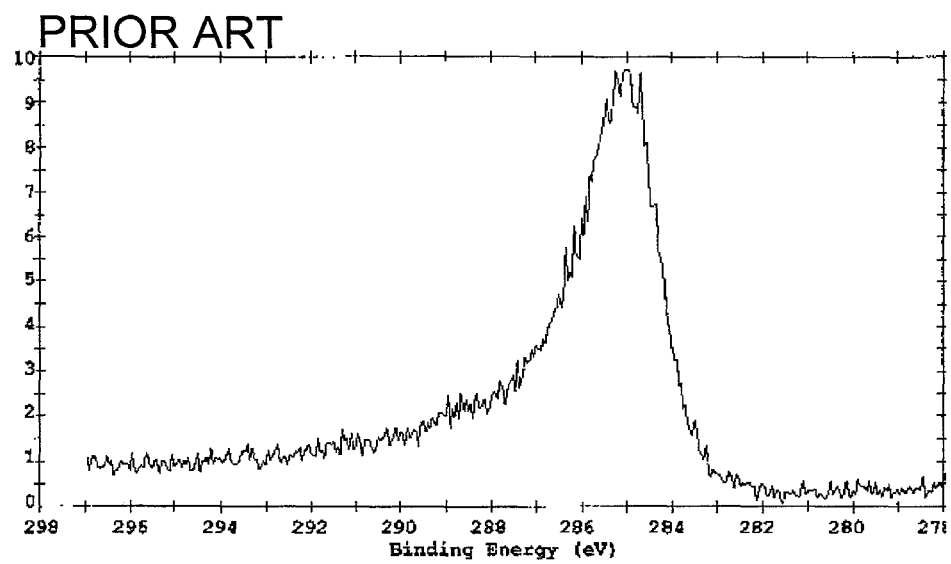
FIG. 3(b) shows the C1s XPS spectrum that indicates the presence of a graphitic layer in a conventional Pb-free chip.
Figure 6:
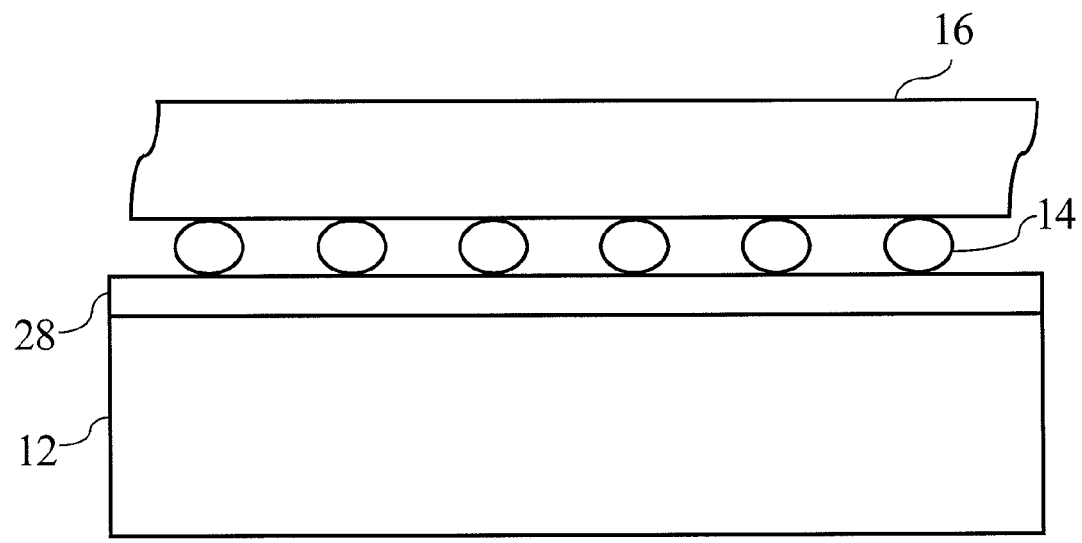
FIG. 6 illustrates an example of an embodiment of an electronic package of a chip and a substrate electrically connected to each other and physically bonded to each other by solder joints.

FIG. 1(b) illustrates an embodiment of a FC-PBGA package that is suitable for use with the embodiments of the invention. Flip chip package 10 comprises chip 12 having a plurality of electrical contacts on a dielectric surface 15 that are electrically connected, for example, by solder joints 14, to correspondingly electrically connect with one or more electrical circuits disposed in the laminate substrate 16. FIG. 6 shows an example of an embodiment of a chip arrangement in which solder material is attached to a chip. A passivation layer 28 formed on the chip 12 supports the solder joints 14. This passivation layer 28 is substantially planar. Vias (not shown) perforate through the passivation layer 28 to allow electrical connections between the solder joints 14 and circuitry within the chip 12 before the solder joints 14 are mounted. The chip passivation layer 28 can be polyimide, photosensitive polyimide, poly(cyclobutene), silicon nitride, silicon oxide, etc. Chip 12 may be comprised of materials such as silicon, germanium, gallium arsenide, copper, silicon oxide, silicon nitride, and polymers. Laminate substrate 16 may be a laminated circuit board having a number of electrical circuits defined within and is adapted for interconnections with other components of an electronic assembly. Laminate substrate 16 may be comprised of materials such as polyimide, polytetrafluoroethylene and composites of polymer and silicate. A suitable material, for example, is an epoxy glass composite commercially available as DriClad™. Underfill material 17 in FIG. 1(b), for example, may be a filled epoxy commercially available, such as Chipcoat U8437™ from Namics Corporation, that partially or fully fills the volume between chip 12 and laminate substrate 16. Flip chip package 10 also comprises thermally conductive member 22 disposed adjacent to the surface of chip 12 that is opposite the first surface of the chip. The thermally conductive member 22 acts as a heat sink to dissipate heat from the chip 12 and laminate 16. Body 26 surrounds chip 12 and contacts at least a portion of laminate substrate 16 and thermally conductive member 22. The encapsulating body 26 may be a resin or epoxy and may extend beyond a periphery 24 of the thermally conductive member 22.

Figure 7:
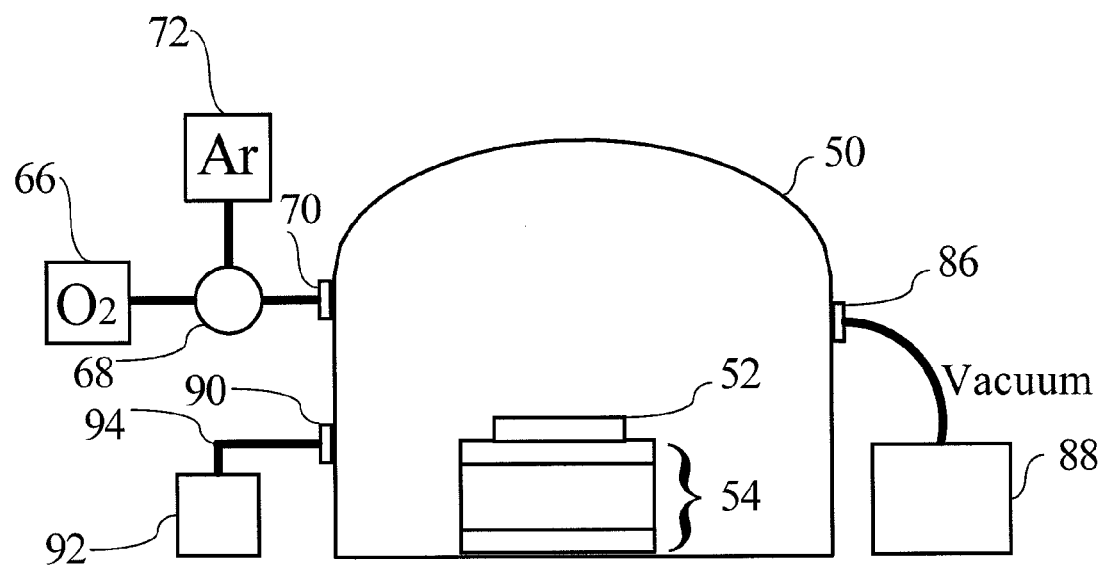
FIG. 7 illustrates an embodiment of a chamber for cleaning residue from a semiconductor wafer.

FIG. 7 illustrates an example of an embodiment of a process chamber 50. For simplicity, only essential features relating to the invention are illustrated. The use of an appropriate mixture of Ar and $O_2$, along with optimized plasma parameters, has been found to remove both graphitic and fluorinated layers as well as calcium sulfate ($CaSO_4$) particles and tin oxide/organotin residue, while metallic compounds experience negligible redeposition. In a non-limiting embodiment, the plasma conditions include dispensing in a range of about 90% to about 95% Ar by volume and in a range of about 5% to about 10% $O_2$ by volume to form a gas mixture at a pressure in a range of about 200 mTorr to about 300 mTorr with a range of about 500 W to about 700 W of power applied to the chamber, for a period in a range of about 5 to about 10 minutes. The plasma may be created by any suitable means, such as with a radio frequency (RF) source 90, with various attachments 94 and equipment 92, to generate the plasma. In an embodiment, a range of about 500 W to about 700 W of power is provided to power the RF source 90. Under the above stated plasma conditions, the residue materials may be etched to a depth of about 80-150 nm. The plasma processing prevents organics from being re-deposited from the polymers to solder contact surfaces and prevents tin oxide thickness buildup on the solder joints. The gas mixture ratio of Ar to $O_2$ gas may be in a range of about 80%/20% to about 95%/5% by volume and the plasma condition may be established to remove 50 nm to 300 nm of polyimide. In experiments, the plasma forming the $Ar/O_2$ gas mixture removed all of the graphitic/fluorinated polymer layers and also decreased the tin oxides and organotin residue by about 30% to about 50% while the redeposition of a metal, such as Sn, measured with XPS was negligible (less than 1% Sn was redeposited). The gas mixture may consist exclusively of Ar and $O_2$ gases. Other embodiments may use other inert gases and other non-inert gases such as Ne, Kr and Xe. Although FIG. 7 shows sources 66, 72 supplying Ar and $O_2$ to the same regulator 68 that mixes the gases in the desired ratio and emits the mixed gas into the chamber through a port 70, the gas sources may be supplied separately into the chamber, as through separate ports. After the process is applied to the wafer, measurements may be made by equipment for quality control. If the wafer test results are satisfactory, the wafer may be diced into individual chips. It has been found that electronic packages assembled with chips formed by the present method have superior reliability.

Figure 5:
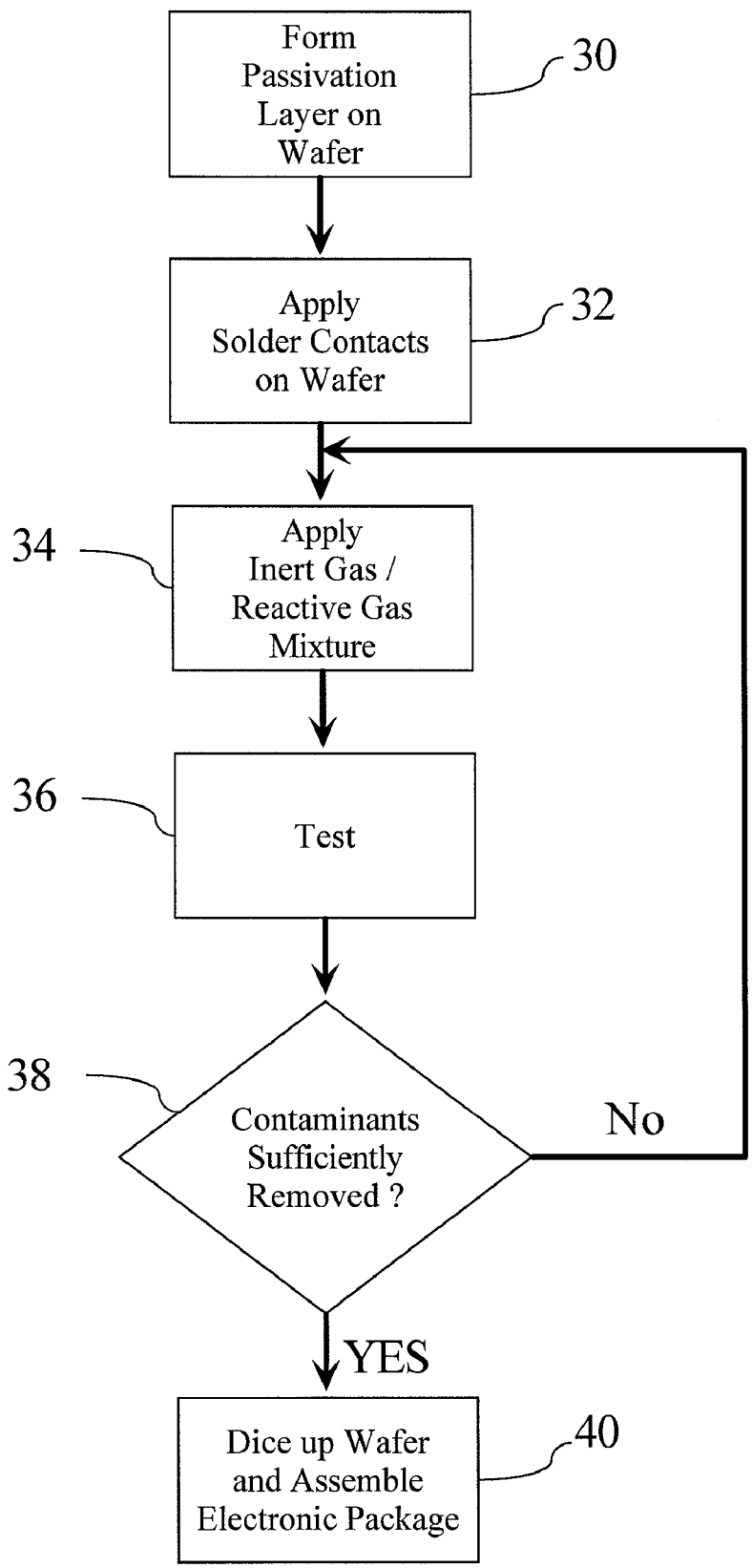
FIG. 5 illustrates a method of removing contaminants from the passivation layer surface of a wafer according to a method of the invention.

FIG. 5 illustrates an example of an embodiment of a method of the invention. A passivation layer 28 is formed on the wafer 30. Vias (not shown) are formed through the passivation layer and then filled with conductive material in appropriate locations in the passivation layer to permit solder balls to electrically connect with the circuitry of the wafer 30. The vias may be formed through photolithographic processes using resists and the conductive material is a ball limiting metallurgy. Solder balls may be made on the ball limiting metallurgy by a plating process or other ways. After the solder balls are connected to the wafer 30, the wafer is diced to get lots of chips. Under prior art methods, undesirable materials, such as graphitic layers, fluorinate layers, CaSO4, tin oxides and/or organotin, sometimes exist. The undesirable materials not only cause underfill-chip delamination in a FC-PBGA package assembled with such a contaminated chip but also they make the post chip join cleaning inefficient to leave flux residue on the passivation layer surface 15 in FIG. 1(b) so that the flux residue can cause underfill-chip delamination. In accordance with embodiments of the invention, the resulting wafer arrangement undergoes plasma processing in which the Ar and $O_2$ mixture are supplied 34 to the process chamber 50 of FIG. 7. Although the use of a reactive gas other than oxygen may be practiced with the invention, oxygen is the preferred reactive gas. The invention prevents re-depositing organics from polymers to solder ball surfaces and prevents an increase in tin oxide thickness on solder balls through plasma processing with an $Ar/O_2$ gas mixture. As was noted above, the ratio of $Ar/O_2$ is in a range from about 80%/20% to about 95%/5%, and the plasma condition is set to remove of a thickness of about 50 nm to about 300 nm of polyimide. Satisfactory results were found with a mixture of about 90-95%/about 5-10% Ar to $O_2$, in which approximately 100-150 nm thick polyimide was removed.

After the plasma process has been applied, the chamber 50 may be evacuated of gases through a port 86 attached to a vacuum pump 88. An X-ray Photoelectron Spectroscopy (XPS) analysis may be conducted after the plasma processing 36 (see FIG. 5). Instead of XPS, Scanning Electron Microscopy (SEM), Transmission Electron Microscopy (SEM), Auger Electron Spectroscopy (AES), or other scanning methods may be used. If an insufficient amount of contaminants is determined to have been removed 38, the plasma processing may be applied further 34. Although not necessary, for convenience, a testing chamber and plasma-processing chamber 50 may be formed as a single chamber.

FIG. 4(b) shows an XPS spectrum of the polyimide surface treated with an $Ar/O_2$ mixture gas plasma. If it is determined a sufficient amount of contaminants have been removed 38 (for example, when the level of contaminants is less than 1% that of the pretreated wafer immediately before treatment), the wafers may then proceed to further processing. For example, the wafer may be diced into individual chips before assembly into an electronic package 40. The subsequently assembled electronics package with the treated chip or the chip from the treated wafer is reliable, as measured by tests such as the Deep Thermal Cycle (DTC) test (e.g., −55/125° C., 1000 cycles) and the Highly Accelerated Stress Test (e.g., 130° C., 85% room humidity, 1.5 V, 96 hours).

It is believed that the invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A method to process a circuit assembly, comprising:
   placing a wafer with the circuit assembly in a process chamber; and
   exposing the wafer to a plasma state that is generated with a mixture of Argon (Ar) and Oxygen ($O_2$) in a range of about 80% Ar and about 20% $O_2$ to about 95% Ar and about 5% $O_2$ by volume, for a period of time sufficient to remove substantially all of a graphitic/fluorinated polymer layer and at least some of a tin residue, where exposing occurs at a gas pressure in a range of about 10 mTorr to about 500 mTorr, at a plasma power in a range of about 100 W to about 1000 W, and where the period of time is in a range of about 1 minute to about 30 minutes, where the wafer comprises a semiconductor wafer upon which are mounted solder balls; and
   repeating the exposing the wafer to the plasma state that is generated with the mixture of Ar and $O_2$ until a sufficient amount of the tin residue is removed.

2. The method to process a circuit assembly as in claim 1, where the solder balls comprise lead.

3. The method to process a circuit assembly as in claim 1, where the solder balls comprise mostly tin but no lead.

4. The method to process a circuit assembly as in claim 1, where the circuit assembly comprises a passivation layer, and where plasma removes substantially all of the graphitic/fluorinated polymer layer and at least some of the tin residue from the passivation layer.

5. The method to process a circuit assembly as in claim 1, where about 30% to about 99% of the tin residue is removed by the plasma.

6. A method to process a circuit assembly as in claim 1, where exposing occurs at a pressure in a range of about 200 mTorr to about 300 mTorr.

7. A method to process a circuit assembly as in claim 1, where exposing occurs at a plasma power in a range of about 500 W to about 700 W.

8. A method to process a circuit assembly as in claim 1, where the period of time is in a range of about 5 minutes to about 10 minutes.

9. A method for removing contaminants from a passivation layer, comprising:
   forming a gas mixture comprised of about 80% Ar and about 20% $O_2$ to about 95% Ar and about 5% $O_2$ by volume;
   exposing the passivation layer disposed on a wafer arrangement to the gas mixture in a plasma chamber where a plasma state is created, the wafer arrangement including a passivation layer and solder balls, where the exposing occurs at a gas pressure in a range of about 10 mTorr to about 500 mTorr, at a plasma power in a range of about 100 W to about 1000 W, for a duration in a range of about 1 minute to about 30 minutes, where the wafer arrangement comprises a semiconductor wafer upon which the passivation layer is disposed and solder balls are mounted on the passivation layer, where the plasma removes substantially all of a graphitic/fluorinated polymer layer and at least some of a tin residue from the passivation layer; and repeating the exposing the passivation layer to the plasma state that is generated with the mixture of Ar and $O_2$ until a sufficient amount of the tin residue is removed.

10. The method as in claim 9, where about 30% to about 99% of the tin residue is removed by the plasma.

11. The method as in claim 9, where exposing occurs at a gas pressure in a range of about 200 mTorr to about 300 mTorr and at a plasma power in a range of about 500 W to about 700 W.

12. The method as in claim 9, where exposing occurs for a duration in a range of about 5 minutes to about 15 minutes.

13. The method to process a circuit assembly as in claim 1, further comprising dicing up the wafer; and assembling one or more electronic packages from the diced up wafer.

14. The method as in claim 9, further comprising dicing up the wafer arrangement; and assembling one or more electronic packages from the diced up wafer arrangement.

15. The method as in claim 9, where the exposing occurs at a pressure in a range of about 200 mTorr to about 300 mTorr and at a plasma power in a range of about 500 W to about 700 W and the period of time is in a range of about 5 minutes to about 10 minutes.

16. The method as in claim 1, wherein the tin residue comprises an organotin residue.

17. The method as in claim 1, wherein the tin residue comprises an inorganic tin residue.

18. The method as in claim 9, wherein the tin residue comprises an organotin residue.

19. The method as in claim 9, wherein the tin residue comprises an inorganic tin residue.

* * * * *